Feb. 28, 1956 J. M. HOLLYWOOD 2,736,805
PHASE SYNCHRONIZED OSCILLATOR
Filed Nov. 14, 1952
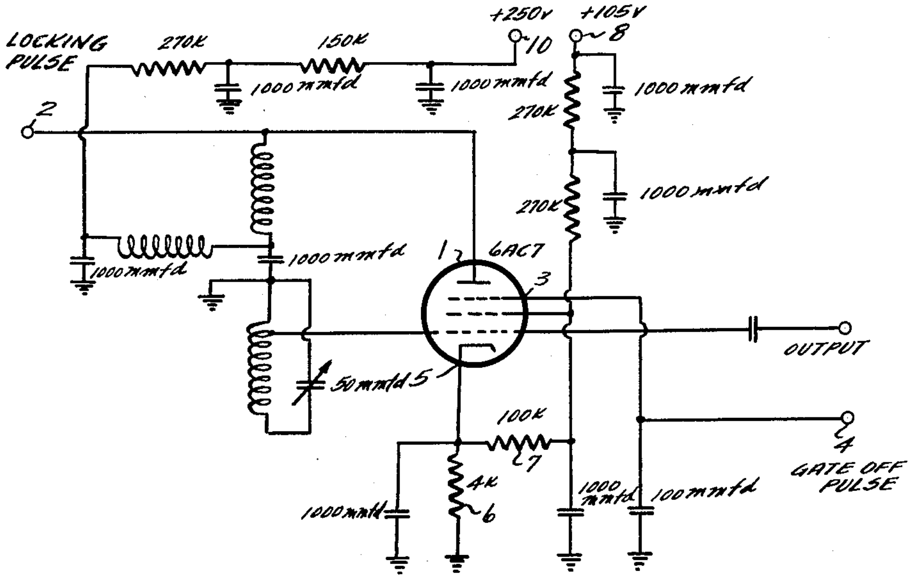
INVENTOR.
JOHN M. HOLLYWOOD
BY Theodore C. Wood
AGENT
Wade Koontz
ATTORNEY

United States Patent Office 2,736,805
Patented Feb. 28, 1956

2,736,805

PHASE SYNCHRONIZED OSCILLATOR

John M. Hollywood, Forest Hills, N. Y., assignor to the United States of America as represented by the Secretary of the Air Force Application November 14, 1952, Serial No. 320,510

2 Claims. (Cl. 250—36)

This invention relates to electronic oscillators and more particularly to phase synchronized oscillators which are synchronized in phase by a locking or synchronizing signal.

In certain types of oscillators, for example, in coherent oscillators, used in "Moving Target Indicator" type radar systems, it is desired that the oscillator be periodically operated and during its operating time it be synchronized in phase with a locking signal. In previously known oscillators of that type the oscillator was periodically stopped by a gating pulse and started again by the removal of that pulse. The removal of the gating pulse might occur just before, during or just after the locking pulse while the resonant circuit of the oscillator was stlli ringing. Examples of those previously known oscillators are shown and described on pages 663 and 664 "Radar System Engineering" by Ridenour, vol. 1 of "Radiation Laboratory Series" published by McGraw-Hill Book Company, Inc., 1947. Those previously known oscillators had the disadvantages that spurious oscillations would occur and the output of the oscillator would not always be in phase with the locking signal.

An object of this invention is to provide a phase synchronized oscillator in which spurious oscillations will not occur.

Another object of this invention is to provide an oscillator which will be synchronized in phase with a locking or synchronizing signal.

The above objects as well as other objects of this invention will be more clearly understood in view of the following description when taken in conjunction with the drawing wherein the single figure illustrates in schematic diagram form an oscillator constructed in accordance with the principles of this invention.

Briefly stated, the oscillator of this invention incorporates a bias applied between the cathode and control grid of the oscillator wherein the bias is of sufficient magnitude that once the oscillator has been stopped, the bias will prevent the oscillator from operating until such time as the locking or synchronizing signal is applied.

Referring now to the drawing, tube 1 has its associated anode and grid circuits arranged such that they are tuned to the frequency of the locking signal which is applied at terminal 2. The tube 1 and its associated circuit is shown as, and is preferably arranged to be, of the Hartley type oscillator. Grid 3 of tube 1 is connected to terminal 4 to which is applied a negative "gating off pulse." The cathode 5 of tube 1 is connected to the junction point of resistors 6 and 7. The resistor 6 is connected to ground and the resistor 7 is connected to a source of positive potential which is applied to terminal 8.

Terminal 2 which is connected to the anode of tube 1 has applied thereto the locking pulse. The anode of tube 1 receives its positive potential through an obvious circuit from terminal 10. With the potentials indicated in the drawing and with the circuit elements having values such as are indicated in the drawing, when a locking pulse is applied to the terminal 2, the oscillator which consists of tube 1 and its associated circuits will produce at its output an oscillating signal whose frequency is determined primarily by the values of the tuned circuit. The values for the elements of the tuned circuit are preferably chosen to have a frequency equal to, as nearly as possible, the frequency of the locking signal. When a negative "gating off" signal is applied to terminal 4, the oscillator will stop and even though the negative gating off signal is removed, the oscillator will remain stopped until the receipt of another locking pulse at terminal 2.

Although particular values for the circuit elements have been shown in the drawing, those values are merely by way of example since it will be obvious that those values may be changed to meet the requirements of any particular application. In any particular application however, the potentials and the values for the circuit elements must be so chosen that the cathode 5 of tube 1 will be biased to such a potential that when the oscillator is stopped, it will not start again until the receipt of a locking signal.

What is claimed is:

1. An oscillator of the phase synchronized type comprising an electron discharge device having at least an anode, a cathode, a first grid and a second grid; a tuned circuit, means to connect said anode and first grid to said tuned circuit so that said electron discharge device will supply sufficient energy to said tuned circuit that it will oscillate whenever said electron discharge device is conducting, means to apply to said second grid a negative gating off signal of sufficient magnitude to cause said electron discharge device to cease to conduct, means to apply to said cathode a fixed bias potential of sufficient magnitude to cause said electron discharge device to remain nonconducting after having been made nonconducting by said gating off signal and after removal of said gating off signal, and means to apply to said tuned circuit an alternating current phase locking signal having substantially the same frequency as the frequency of said tuned circuit and of sufficient magnitude to cause said electron discharge device to conduct.

2. Apparatus as in claim 1 wherein said electron discharge device has a third grid between said first and second grids, said third grid being a screen grid, and wherein the means to apply a fixed bias potential to said cathode comprises a first and second resistor connected in series, said cathode being connected to the junction point of said resistors, the other end of said first resistor being connected to ground and the other end of said second resistor being connected to said screen grid, said screen grid also being connected to a source of fixed positive potential, a first capacitor connected from ground to the junction point of said first and second resistors and a second capacitor connected from ground to said screen grid, said first grid having a direct current connection to ground through said tuned circuit.

References Cited in the file of this patent

UNITED STATES PATENTS

| | | |
|---|---|---|
| 1,923,345 | Wallace | Aug. 22, 1933 |
| 2,551,308 | Adler | May 1, 1951 |
| 2,591,088 | Millman | Apr. 1, 1952 |
| 2,659,009 | Emslie | Nov. 10, 1953 |